United States Patent
Varshavsky

(12) 
(10) Patent No.: US 6,470,328 B1
(45) Date of Patent: Oct. 22, 2002

(54) ARTIFICIAL NEURON ON THE BASE OF B-DRIVEN THRESHOLD ELEMENT

(75) Inventor: Victor I. Varshavsky, Aizu-Wakamatsu (JP)

(73) Assignee: Monolith Company, Ltd., Tokyo (JP)

( * ) Notice: Subject to any disclaimer, the term of this patent is extended or adjusted under 35 U.S.C. 154(b) by 0 days.

(21) Appl. No.: 09/480,327

(22) Filed: Jan. 10, 2000

Related U.S. Application Data

(63) Continuation-in-part of application No. 09/370,939, filed on Aug. 9, 1999.

(30) Foreign Application Priority Data

Aug. 7, 1998 (JP) .......................................... 10-224994

(51) Int. Cl.[7] .......................... G06F 15/18; H03K 19/23
(52) U.S. Cl. .......................................... 706/33; 326/35
(58) Field of Search ........................ 706/33, 25; 326/35

(56) References Cited

U.S. PATENT DOCUMENTS

| 5,258,657 A | 11/1993 | Shibata et al. ................. 326/35 |
| 5,706,403 A | 1/1998 | Shibata et al. ................. 706/25 |

FOREIGN PATENT DOCUMENTS

| JP | 3-6679 A | 1/1991 |
| JP | 6-139380 A | 5/1994 |
| JP | 10-54079 A | 8/1999 |

OTHER PUBLICATIONS

Varshavsky et al, "Implementability, Restrictions of the Beta–CMOS Artificial Neuron", IEEE International Conference on Electronics, Circuits and Systems, Sep. 1999.*

Varshavsky. (Feb. 19–21, 1998). "β–Driven Threshold Elements," *Proceedings of the 8th Great Lakes Symposium on VLSI*. Bayoumi et al. eds., IEEE Computer Society: Los Alamitos, CA. pp. 52–58.

Varshavsky. (Oct. 11–14, 1998). "CMOS Artificial Neuron on the Base of β–Driven Threshold Element," IEEE International Conference on Systems, Man, and Cybernetics.

* cited by examiner

*Primary Examiner*—George B. Davis
(74) *Attorney, Agent, or Firm*—Morrison & Foerster LLP

(57) ABSTRACT

A synapse element consisting of a smaller number of elements utilizing common semiconductor technology, and a neuron circuit and a neuron device using the synapse elements are provided. The synapse element comprises a transistor set consisting of two MIS transistors connected in series. The first transistor adjusts the effective β-value of the transistor set so as to correspond to the weight factor ω via voltage applied to its gate electrode, and the second transistor switches the current according to input voltage to its gate electrode, so that output of the transistor set represents synapse output ωX. A voltage holding element and a switching element furnished to the gate of the first transistor give the neuron device a learning ability.

17 Claims, 8 Drawing Sheets

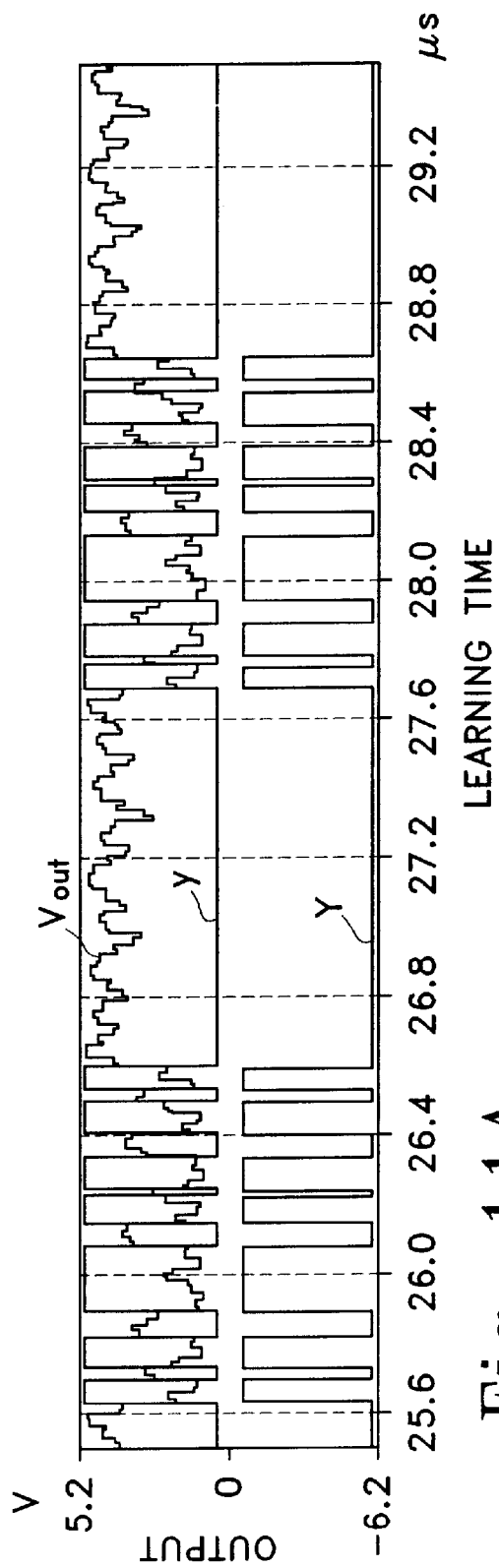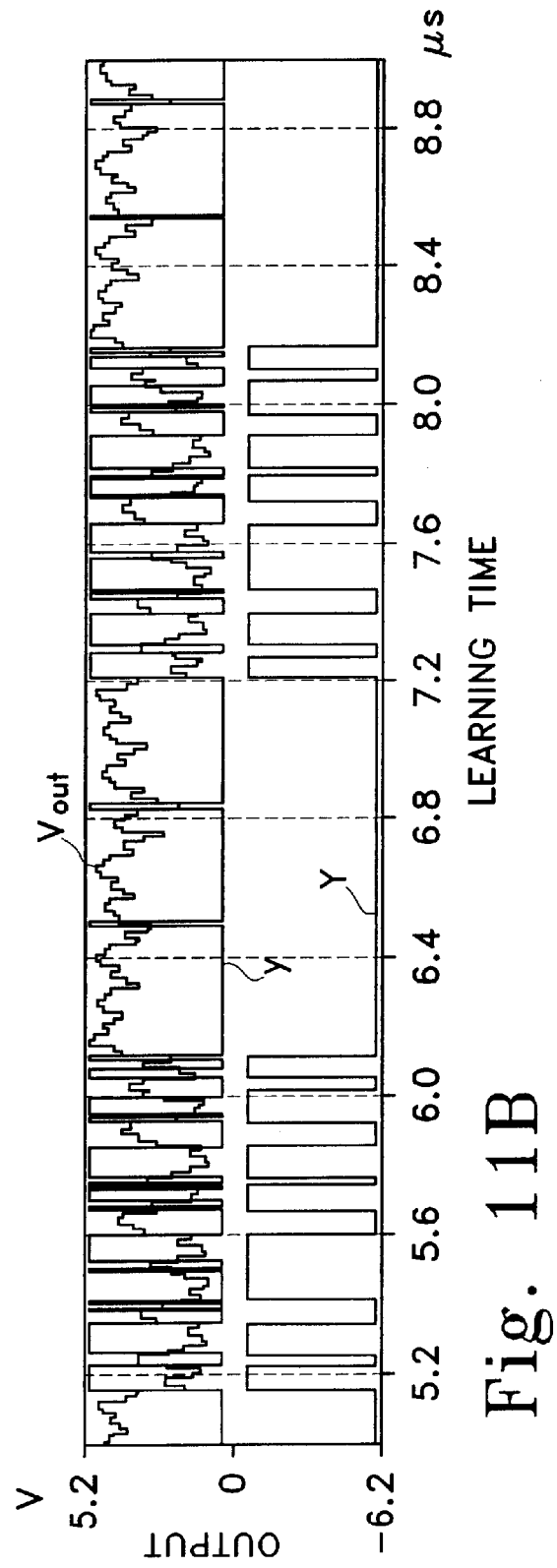

US 6,470,328 B1

ARTIFICIAL NEURON ON THE BASE OF B-DRIVEN THRESHOLD ELEMENT

CROSS-REFERENCE TO RELATED APPLICATIONS

This application is a Continuation-in-part of prior application Ser. No. 09/370,939, which was filed Aug. 9, 1999 which is currently pending, and which also claims priority to Japanese application no. 10-224994 filed Aug. 7, 1998. Application Ser No. 09/370,939 is hereby incorporated herein by reference thereto, in its entirety,

BACKGROUND OF THE INVENTION

1. Field of the Invention

This invention relates to hardware implementation of artificial neuron, specifically to a synapse element, a threshold circuit or a neuron circuit using the synapse elements, and a learnable neuron device.

2. Description of the Related Art

The highly developed Neumann-type computer has a far better performance in numerical calculation compared with the human ability. This type of computer still requires vast calculating time in pattern recognition or image processing, and it is insufficient especially in information processing such as association, memorization and learning which are easily performed by a human brain. There is an approach to utilize neural networks constructed by simulating functions of the human brain for providing the computer calculating facilities to perform the above processings.

The human brain has highly sophisticated functions though its basic construction is rather simple. The brain consists of nerve cells called neurons having calculating functions and nerve fibers propagating the calculated results to the other neurons. A neuron connects to nerve fibers by so-called synapse links, and the synapse links provide the neuron with the signals propagated through each nerve fiber after modifying them each with a proper weight function. The neuron is stimulated to provide an output signal to the nerve fibers connected to other neurons, which phenomenon is called fire, only when the total sum of the signals input through the nerve fibers exceeds a certain threshold value, while the neuron does not produce any output signal when the total sum is lower than the threshold value.

The human brain having a six-layer structure of a vast number of neurons connected each other performs complex information processings. The human learning process can be recognized as a process for changing the weights in the synapse links.

The neural networks are calculation structures constructed by complied layers in multiple stages formed of a vast number of elements having neural function connected each other modeling the nervous network of human brain. Therefore, the neural networks are expected to perform more easily high-degree processings of information such as pattern recognition, image processing, association, memorization, learning, and so on.

The development of semiconductor technology in recent years brings possibility to provide physical neural networks based on their conceptional designs.

Today's and especially future networks require or can require hundreds or even thousands of neurons with hundreds of input synapses each. Saving just one transistor saves tens and hundreds of thousands transistors.

A threshold element (TE) has been commonly studied because it is the simplest model of the neuron. A threshold element is proposed to be constructed by νMOS circuits having analogue amplifiers, output wired inverters, or floating gates.

The critical parameter is the permissible sum of the input weights and threshold which depends on possible variations of technological and physical parameters. In the learnable neurons, the parameter variations are compensated during the learning and the critical parameter becomes the sensitivity of the output amplifier that, in fact, is of the same order for most available implementations. Hence, the main criterion for choosing the basic TE when implementing a learnable artificial neuron should be the number of transistors per one synapse.

In the conventional semiconductor technologies, a vast number of semi-conductors should be combined to realize the functions in only one neuron. Even a limited number of semiconductors required in a restricted practical use cannot be integrated in a single semiconductor chip, so that construction of practical neural networks is a sufficiently difficult technical task.

JPA03-006679 discloses an invention for integrating the functions of one neuron onto one MOS (metal-oxide semiconductor structure) transistor so as to solve the above problem.

The above disclosed semiconductor device is a MOS semiconductor element called νMOS with a floating gate and a plural number of capacitance coupling input gates. Each of the input gates is equipped with an electrode having a proper area corresponding to its input weight. The input voltage provided to the input gate is multiplied with the proper weight determined by the electrode area. And the sum of the input voltages provided to the relating input gates corresponds to the voltage of the floating gate. When the sum exceeds a certain threshold level, a channel is formed under the floating gate electrode and an electric current runs through the channel as corresponding to the neuron's fire.

νMOS enables to decrease the transistor area in the semiconductor chip by tenth order as the number of the required bipolar transistors is decreased, and to realize low power consumption as MOS transistors are voltage-controlled devices. Thus the above approach is expected to obtain a real neuron computer.

According to the above technology in which the weights are determined by the capacitance coupling of the input gates to the floating gate, the number of the inputs and the weights to be applied to the inputs cannot change after building the device, because they are fixed by the structure of the νMOS. Therefore, the device is impossible to simulate flexible ability of the human brain relating information processings as recognition, association, learning, and so on.. A method for solving the problem is proposed in which the device is furnished with multipliers for adjusting parameters and the adjusted parameters are applied to the input signals and then the input signals are provided to the νMOS. The device applied with the above method has much flexibility in functions though it needs more semiconductors per one synapse.

JPA6-139380 discloses a νMOS furnished with a self-learning facility. The disclosed device adjusts charges in the floating gate when the calculated value differs from the indicated value so as to adjust the weight of the synapse. This device can automatically adjust the weight function of the synapse which provides signals to the neuron, thus it can eliminate the need of an outstanding computer to calculate the weight of each synapse and may obtain an optimal control of the system through learning on the spot. Simulations have proven a high degree optimization in some logics to be executed.

JPA10-54079 discloses a β-driven threshold element (βDTE) invented by the inventor of this invention.

Any linear logics and some kind of logics can be represented in the threshold function below:

$$Y=\text{Sign}(\Sigma_{j=0-n-1}\Omega jxj-T)=\text{Sign}(\Sigma_{j\in S}\Omega jxj-\Sigma_{j\in S}\Omega j!xj)$$

where S is a subset of variables such that $\Sigma_{j\in S}\Omega j=T$, ! means negation, Xj is 0 or 1, and Ω is an integer.

Ω j is normalized with T to obtain $\omega j=\Omega j/T$. Parallel connected p-channel MOS transistors whose input xj belongs to a certain subset S and its β-value is adjusted to the corresponding ωj are serially connected with parallel connected n-channel MOS transistors whose input does not belong to the subset S and its b-value is adjusted to the corresponding ωj. Then the output voltage Vout at the terminal connecting point is indicated as follows:

$$vout=\Sigma_{j\in S}\omega jxj/\Sigma_{j\in S}\omega j!xj \quad (1)$$

Therefore, a comparator inverter easily determines truth of the threshold function by comparing the output Vout with threshold value a, which is set as follows:

$$\alpha=\Sigma_{j\in S}\omega j/\Sigma_{j\in S}\omega j!=\Sigma\beta n/\Sigma\beta p \quad (2).$$

The βDTE is constructed according to the above principle. FIG. 13 is a circuit diagram indicating a principle of the βDTE.

Variables Xj belonging to the subset S in n number of Xj's described in the logics are provided to p-channel MOS transistors P1, P2, . . . Pk. Variables Xj which are not belong to the subset S are provided to n-channel MOS transistors N1, N2, . . . Nn–k. The drain of the whole transistors are connected each other. The voltage Vout appearing at the connected drain is provided to the comparator inverter having a threshold value of a, and the output from the comparator inverter represents the final result Y.

This type of βDTE needs one MOS transistor corresponding to one input, and provides a threshold element consisting of a least number of transistors. The current amplification factor β is determined by length and width of the gate electrode, so that the input weight function ωj can be determined by width of the transistor.

The brain has a main advantage in learning ability, therefore if an artificial neural network has not learning function the network cannot sufficiently simulate the information processing function of the human brain.

The above described conventional arts have some problems such that the input weights are to be fixed without learning functions because the artificial neuron is built up using a special structure of semiconductors and cannot vary the weights after completion, or that the device should furnish with an excessive equipment as multipliers for adding learning facility although the device itself may be a simple synapse or a simple neuron.

SUMMARY OF THE INVENTION

It is therefore an object of this invention to provide a synapse element, a neuron circuit and a neuron network, and especially a learnable neuron device, consisting of a smaller number of elements utilizing the commonly used semiconductor technologies.

Other object of the invention will appear in the course of the description thereof which follows.

To achieve the foregoing objects, a synapse element of the invention comprises a transistor set made of the first MIS (metal insulator semiconductor) transistor having the first gate electrode and the second MIS transistor having the second gate electrode. The second MIS transistor is connected in series with the first MIS transistor. The voltage of the first input signal provided to the first gate electrode adjusts the effective b-value of the transistor set. And the transistor set is switched according to the second input signal provided to the second gate electrode.

In place of the transistor set having two transistors, a single transistor having two separated electrodes may be used in which the effective b-value of the single transistor can be adjusted by the input voltage applied to the first electrode.

The synapse of the invention preferably includes a voltage holding element connected with the first gate electrode, and a switch element between the first gate electrode and terminals each connected to a high voltage power source and to a low voltage power source, in which the switch element is switched according to the second input signal.

The switch element may be a MIS transistor receiving the second input signal by its gate electrode, and the voltage holding element may be a capacitance element.

In the synapse element of the invention, the effective b-value is adjusted by the first transistor and turning on and off is controlled by the signal input to the second transistor, therefore the input weight of the synapse can be easily selected and fixed by adjusting the effective b-value of the transistor. According to the invention, an element simulating a synapse can be constructed which generates an output signal applied with a weight to an input signal propagated through a nerve fiber.

The synapse element of the invention can be constructed by MIS transistor elements of usual type because the synapse element, unlike the conventional synapse element, does not require any special construction of the gate electrode or any adjustment of geometrical sizes of the respective transistors.

The synapse element of the invention requires very few MIS transistors, therefore the synapse element can be easily constructed on a single substrate and a plurality of the synapse elements may be integrated in a smaller area of the substrate.

In a learnable neuron device composing of the synapse elements having voltage holding elements such as capacitors and switching elements using MIS transistors thereby maintaining the effective b-value by holding the voltage applied on the gate electrode and turning the switching elements on and off according to the input signal applied on the second transistors, appropriate synapse elements can be easily selected to be varied with their weights on learning and the voltage applied on the selected elements can be adjusted in the proper direction.

If the elements are composed of MIS transistors, the whole device can be formed on a single substrate so that a very small device integrated with a vast number of synapse elements may be provided.

To achieve the foregoing objects, a threshold circuit of the invention is characterized in comprising any one of the above described synapse elements connected in parallel whose second transistors have input terminals, a common line connected with the first connecting terminals of the synapse elements connected in parallel, a power line connected with the second connecting terminals of the synapse elements through a third MIS transistor having a complementary channel type, and an output inverter connected with the second connecting terminals by the input terminal of the inverter.

It is preferable that the MIS transistors of the synapse elements are n-channel MOS (metal-oxide semiconductor) transistors and the third MIS transistor is a p-channel MOS transistor.

A second threshold circuit of the invention comprises a positive power line connected to a positive electrode of a power source, a negative power line connected to a negative electrode of the power source, a plurality of n-channel transistor sets each composing of a first n-channel MIS transistor and a second n-channel MIS transistor connected in series with the first MIS transistor, at least one p-channel MIS transistor, and an output inverter, wherein the first n-channel MIS transistor adjusts an effective β-value of the transistor set according to the voltage applied on the gate electrode of the first n-channel MIS transistor and the second n-channel MIS transistor switches the transistor set by applying an input signal on the gate electrode of the first MIS transistor. In addition, the positive power line is connected with the source electrode of the p-channel MIS transistor and the negative power line is connected with the gate electrode of the transistor, the plurality of the n-channel transistor sets are connected in parallel with each other, the source electrode terminals of the parallel connected n-channel transistor sets are connected with the negative power line, and the drain electrode terminals of the transistor sets are connected to the drain electrode of the p-channel MIS transistor, and the drain electrode terminal of the p-channel transistor is connected to the input terminal of the output inverter.

The threshold circuit of the invention simulates a neuron function element which determines if the sum of input signals each applied with an arbitrary weight exceeds a certain threshold value, wherein the weight is determined by adjusting β-values of synapse elements connected in parallel and the synapse elements are corresponding to an arbitrary number of input signals, respectively.

The main components of the threshold circuit are MIS transistors and the number of the transistors used in the circuit is small, therefore many circuits are easily integrated in a narrow area on a semiconductor substrate.

The threshold circuits of the invention are applied to artificial neuron networks, majority logic circuits, filtering circuits, and so on.

Any of the above mentioned threshold circuits can be constructed with synapse elements each having an effective β-value corresponding to a weight ωi derived from a logical equation $Y=sign(\Sigma \omega i X i - 1)$ transformed from a logical equation $Y=F(Xi)$, and a comparing element compares a combined output signal with a threshold value and provides a comparison result.

Small and economic integrated circuits for deciding truth of logical equations are obtained with very small number of usual semiconductors by the above-described method to set the effective β-values.

And a neuron device of the invention, to achieve the foregoing objects, comprises a threshold circuit composed of a plurality of synapse elements each of which is adjusted with its effective β-value from the outside and generates an output signal controlled by the β-value upon receiving an input signal, an input signal generator for providing corresponding input signals to each input terminal of the synapse elements, a truth table circuit for providing expected values of output signals corresponding to any given set of input signals, a comparator for comparing the output signals of the threshold circuit with the expected values of the output signals, adjusting device for generating increment signals or decrement signals selectively based on the output signals of the comparator, wherein the adjusting device and a β-value adjusting terminal of the synapse element are connected only when the synapse is stimulated by the input signal.

It is preferable that the threshold circuits of the neuron device of the invention are the threshold circuits of the invention described above.

A second neuron device of the invention comprises a first current-control element, a second current-control element which is connected with the first current-control element in series laying between a first voltage and a second voltage, an auxiliary circuit for varying characteristic factor of at least the second current-control element and providing the input signal to at least one of the second current-control elements, and a threshold deciding circuit for receiving an intermediate voltage which appears at the connection point of the first current-control element and the second current-control element, wherein the auxiliary circuit controls the intermediate voltage corresponding to even a same set of the input signals so as to adjust results of threshold decision process.

The first current-control element may be constantly conductive, while the second current-control element is controlled on and off by the input signal applied to the element.

A plurality of the second current-control elements may be connected in series so as to receive a plurality of input signals.

It is preferable that the first current-control element and the second current-control element are complementary field-effect transistors to each other.

A current amplification factor may be used as the adjustable characteristic factor of the current-control elements.

The auxiliary circuit may comprise a voltage holding element connected with the gate electrode of the field-effect transistor and a switching element for controlling an electric current charging or discharging the voltage holding element, wherein the switching element is opened or closed according to the input signal.

It is preferable that the second current-control elements are connected in parallel, and the neuron device further comprises an adjusting device for controlling the auxiliary circuit according to the comparison result of the threshold decision and the expected values so that the neuron device furnishes a learning ability.

The neuron device of the invention provides a neuron network having very few semiconductor elements which can adjust the input weights of the synapses by comparing the output results with the expected values and can display a learning ability resembling human ability by maintaining the adjustment results.

BRIEF DESCRIPTION OF THE DRAWINGS

The accompanying drawings which are incorporated in and constitute a part of this specification, illustrate one embodiment of the invention and, together with the description, serve to explain the principles of this invention.

FIG. 11A is a wave form diagram at learned stage showing a test result of learning ability of the neuron device of the invention;

FIG. 11B is a wave form diagram at early stage showing a test result of learning ability of the neuron device of the invention;

DESCRIPTION OF THE PREFERRED EMBODIMENT

When a synapse element is formed on a semiconductor substrate using MIS (metal insulator semiconductor) transistors or MOS (metal-oxide semiconductor) silicon transistors, the current amplification factor $\beta j$ of the j-th synapse transistor is expressed by a well-known relationship as follows:

$$\beta j = \mu \epsilon / tox (Wj/Lj) = \mu \epsilon / tox (Wo/Lo) \omega \quad (3)$$

where $\mu$ is the mobility factor of electrons in the channel region of the transistor, $\epsilon$ is the permittivity of the insulator, tox is the thickness of the insulator, and Wj and Lj are respectively the width and length of the j-th transistor.

When a certain weight $\omega j$ is given, the necessary $\beta$-value $\beta j$ is realized by adjusting the width Wj and the length Lj of the electrode in accordance with the values obtained by the equation:

$$Wj/Lj = (Wo/Lo)\omega j$$

based on the standard width Wo and length Lo.

Thus the synapse element having an input weight $\omega j$ for input signal Xj for providing an output signal corresponding to $\omega j X j$ is easily obtained through geometrical sizes of the synapse element.

But the above-described method for adjusting $\beta$-value of the transistor through its geometrical sizes has a disadvantage that it is almost impossible to change the weight factors.

Figure 1:
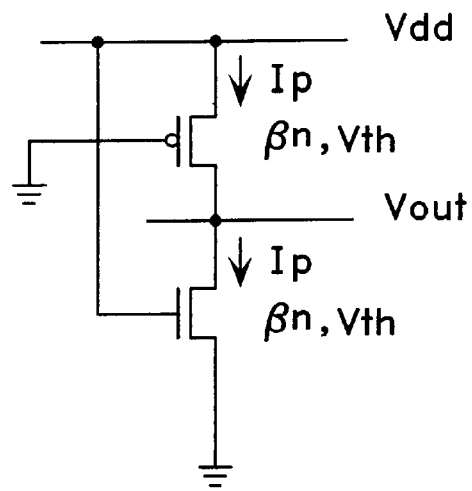
FIG. 1 is a circuit diagram of the CMOS transistors for explaining the principle of the present invention.

Now, let us consider a CMOS couple with fully open n- and p-transistors as shown in FIG. 1. If Vth<Vout<Vdd−Vth, both transistors are in the non-saturated mode and hence:

$$In = \beta n((Vdd-Vth)Vout-Vout^2/2) \quad (4)$$

$$Ip = \beta p((Vdd-Vth)(Vdd-Vout)-(Vout-Vout)^2/2) \quad (5)$$

where In and Ip are the drain currents flowing through the n- and p-channel MOS transistors respectively, $\beta n$ and $\beta p$ are the current amplification factors of the n- and p-channel transistors respectively, Vdd is the power voltage applied to the gates, Vth is the threshold voltage of the transistors, and Vout is the output voltage or the drain voltage. For simplicity, the threshold voltage Vth is assumed to have the same value for both transistors.

As shown in the equation (4), the drain current In flowing through the transistor is proportional to the current amplification factor $\beta n$. Therefore, the effective b-value $\beta n$ can be adjusted via controlling the drain current In by adjusting the gate voltage.

Figure 2:
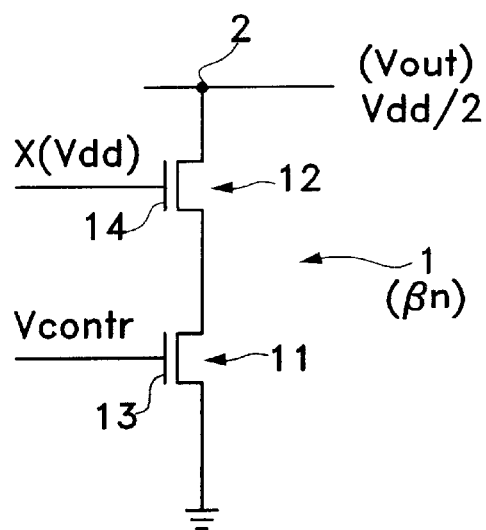
FIG. 2 is a circuit diagram of a synapse element of the invention.

The synapse element above is easily realized in the circuit in FIG. 2, for example. FIG. 2 shows a transistor set 1 with two n-channel MOS transistors connected in series which is connected with another complementary p-channel transistor (not shown) and disposed between the power line and the ground line. The part of the transistor set 1 of n-channel MOS transistors has a terminal connecting to a power line 2 and supplied with an intermediate power voltage Vdd/2, and another terminal connecting to the ground line 3.

The first transistor 11 of the transistor set 1 has a gate electrode 13 supplied with a current-control voltage Vcontr for controlling the current flow and the second transistor 12 has a gate electrode 14 supplied with an input signal corresponding to the synapse input. When the input signal is ON, the second transistor 12 conducts the current as the power voltage Vdd is applied to the gate electrode 14, therefore the current restricted by the first transistor 11 flows through the transistor set 1.

When the intermediate power voltage Vdd/2 applied to the transistor set 1 is in the floating status, the voltage of the gate electrode 14 is varied according to the current flowing through the transistor set 1, and the voltage turns to correspond to the output voltage Vout of the synapse element.

Figure 3:
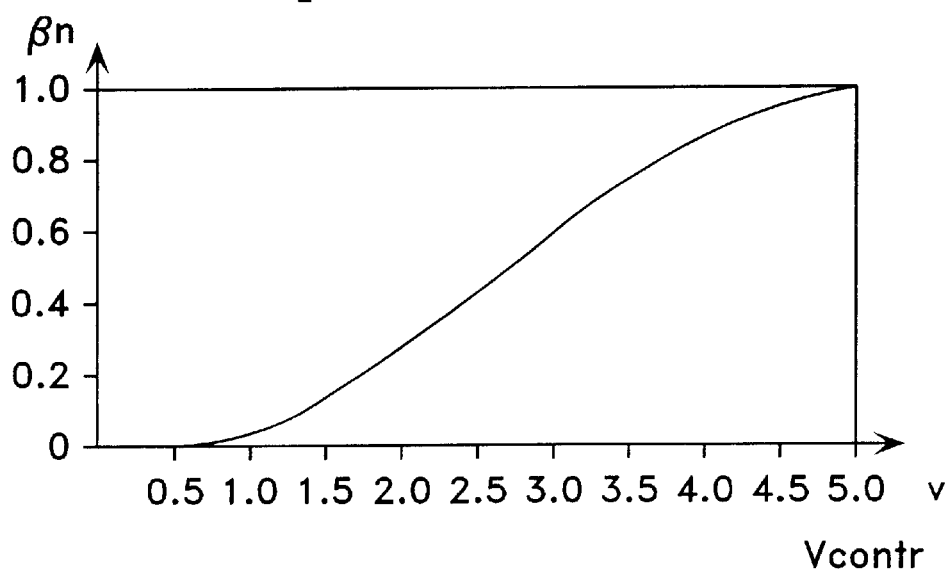
FIG. 3 is a chart showing the relation of the effective , β-value of a synapse element and its input signal.

FIG. 3 shows a result of a circuit simulator SPICE calculating the effective $\beta$-value $\beta n$ of the transistor set 1 corresponding to variation of the current control voltage Vcontr applied to the first transistor 11. The axis of ordinates represents $\beta n$, the axis of abscissas represents Vcontr. The unit of $\beta n$ shows the $\beta$-value when the current control voltage Vcontr takes the same value as the power voltage Vdd.

FIG. 3 tells that the effective $\beta$-value monotonously increases from the point where the current control voltage Vcontr is about 0.8 V around the threshold voltage up to the point where the current control voltage Vcontr reaches 5 V. Therefore, arbitrary $\beta$-value can be realized by setting an appropriate value to the current control voltage Vcontr.

Thus, a synapse of compact layout for providing an output signal derived from an input signal multiplied with a controlled weight can be implemented on two transistors which have controllable characteristic factors via input signals provided from outside. With CMOS implementation, such a synapse will obviously have minimum area.

Figure 4:
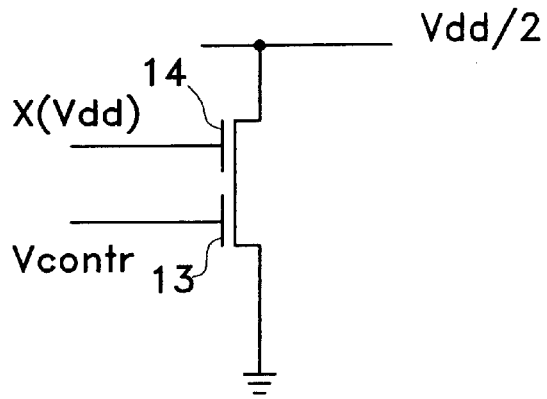
FIG. 4 is a circuit diagram showing another aspect of the synapse element.

The first transistor and the second transistor can also be implemented on one transistor. FIG. 4 shows an example of one-transistor synapse element having controllable effective $\beta$-value. One MIS transistor has a gate electrode divided into two areas 13 and 14, the first divided electrode 13 is provided with the current control voltage Vcontr to control the effective $\beta$-value, and the second divided electrode 14 is provided with input signal. This construction provides simple procedure for manufacturing synapse elements and smaller area occupied by synapse elements.

Figure 5:
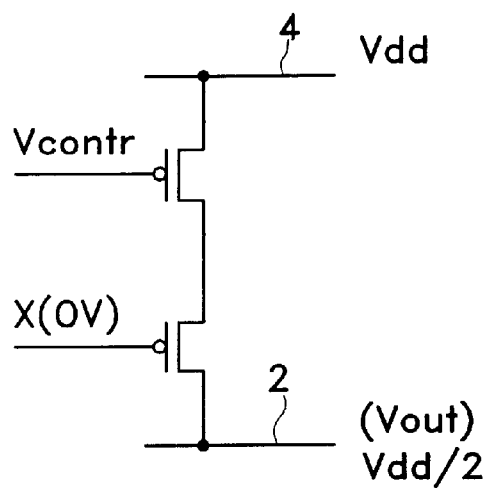
FIG. 5 is a circuit diagram showing further aspect of the synapse element.

In the above embodiment, the synapse element is constructed by n-channel MOS transistors. Alternatively, complementary p-channel MOS transistors may construct synapse elements as shown in FIG. 5. The synapse element of FIG. 5 can also be implemented on one transistor. In the case of p-channel transistor, the transistor is disposed between the power line 4 supplied with the power voltage Vdd and the power line 2 provided with the intermediate voltage Vdd/2, and the output signal Vout of the synapse element appears at the intermediate voltage line 2.

Corresponding to the memorizing function of the synapse, the gate electrode may be furnished with a voltage holding element such as capacitance element for maintaining voltage potential by accumulating electric charges so as to hold the current control voltage Vcontr at the value once set in accordance with an appropriate β-value.

Figure 6:
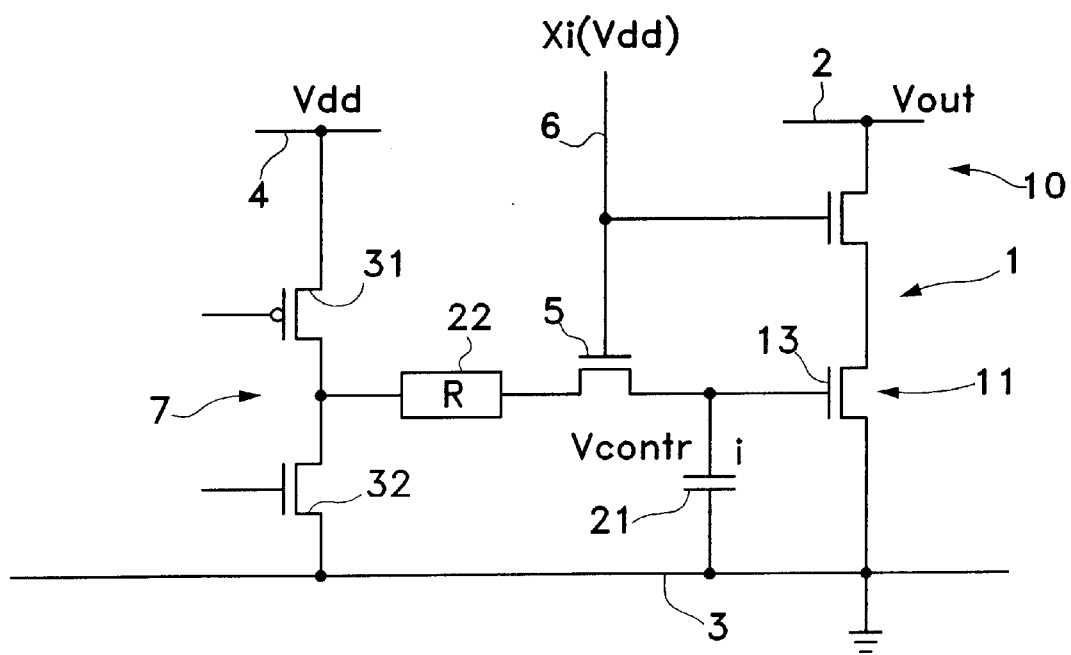
FIG. 6 is a circuit diagram showing a part around a synapse element in a neuron device of the invention.

FIG. 6 shows a circuit of an example of the synapse element 10 furnished with a voltage holding element.

A capacitor 21 is connected between the ground line 3 and the gate electrode 13 of the first n-channel MOS transistor 11 of the synapse element. The capacitor 21 can be applied with an electric current via a resistor 22. An n-channel MOS transistor 5 disposed between the capacitor 21 and the resistor 22 forms a switching element for making and breaking the electric current.

The resistor 22 is an element for determining a time constant in charging and discharging the capacitor 21. The resistor in the switching MOS transistor 5 may be utilized for the above resistor 22.

A transistor set 7 for adjustment consisting a p-channel MOS transistor 31 and an n-channel MOS transistor 32 connected in series with the p-channel transistor 31 is disposed between the power line 4 and the ground line 3, and the gate electrode of each transistor is connected with control line from outside. The resistor 22 is connected with the connecting point of the drain terminals of both transistors.

The p-channel MOS transistor 31 is driven by a control signal having the ground potential so as to charge the capacitor 21 via the resistor 22 and the switching transistor 5 and to increase the potential of the capacitor 21. The n-channel MOS transistor 32 is driven by a control signal having the power voltage Vdd so as to discharge the capacitor 21 to the ground line and to decrease the potential of the capacitor 21. The potential of the capacitor 21 adjusts the effective β-value so that the weight of synapse element may be adjusted.

The role of the capacitor 21 is to maintain the gate potential of the first n-channel MOS transistor 11 at an appropriate value relative to the potential voltage of its source. Therefore, the other terminal of the capacitor 21 maybe connected to any point having a constant potential relative to the source potential.

The second n-channel MOS transistor 13 and the switching MOS transistor 5 are connected to the line 6 for providing input signals via their gate electrodes. Each of the MOS transistors conducts current while being supplied with an input signal having the power voltage Vdd, and breaks current while being provided with no input signal. In learning process including adjusting the weight functions to the appropriate values, only the synapse elements concerning with the output signal which are provided with input signals are required to change the potential of the capacitor 21.

The voltage holding elements may be MOS diodes, MOS condensers, MOS transistors having a floating gate, and so on. If the voltage holding elements are made from MOS elements, it is advantageous for the voltage holding elements may be easily formed by a usual semiconductor process on the same substrate where the synapse element is deposited.

Figure 7:
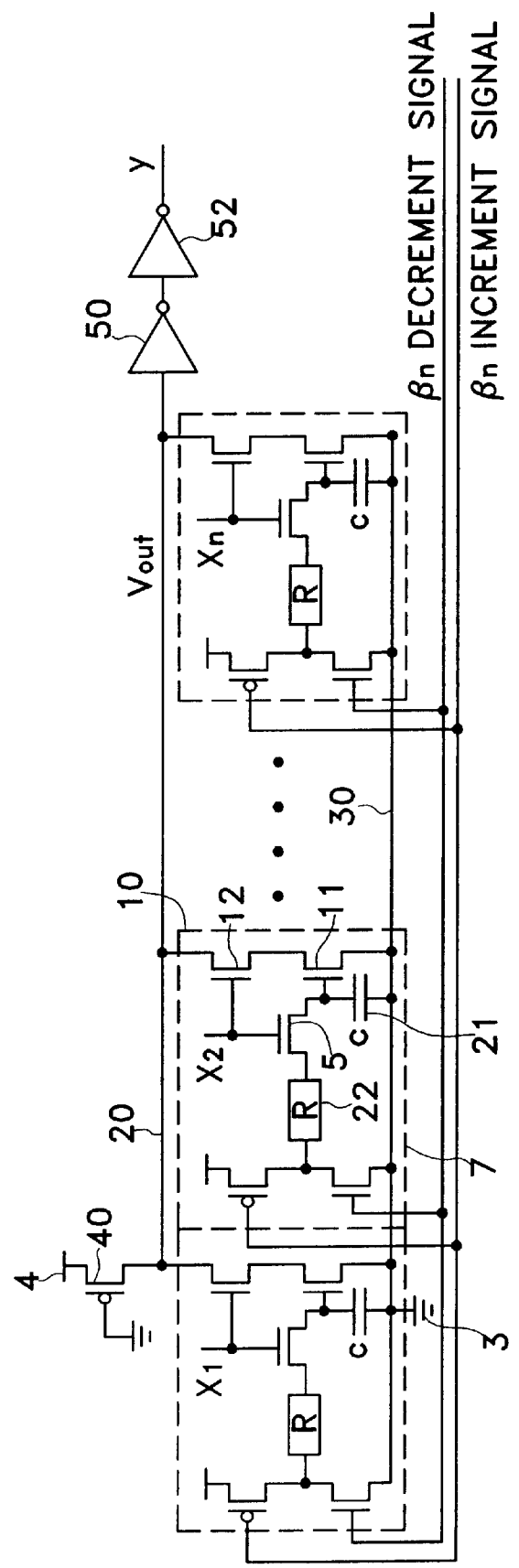
FIG. 7 is a circuit diagram showing a neuron device of the invention.

FIG. 7 shows a threshold circuit, or a neuron circuit, having n learnable synapse elements.

Two n-channel MOS transistors are connected in series to form a synapse element 10. The same number of the synapse elements 10 as the number of the input terminals are connected in parallel. A connecting line 20 connect ing the drain terminals of the synapse elements 10 is connected to the drain of a p-channel MOS transistor 40 and to the input terminal of a comparing inverter 50.

A connecting line 30 connecting the source terminals of the synapse elements 10 is connected to the ground 3.

The source terminal of the p-channel MOS transistor 40 is connected to the power line 4, and the gate terminal to the ground 3, so that the transistor is usually ON.

An output signal of the comparing inverter 50 is provided as the decision result of the synapse element after being inverted by the output inverter 52.

Each of the synapse elements is adjusted so that the effective β-value βi has a corresponding value to the weight ωi to be applied on the input Xi of the synapse according to the gate voltage determined by the electric charges held in the capacitor 21 attached to the first n-channel MOS transistor 11.

During logical operation of the neuron circuit, both transistors of the adjusting transistor set 7 do not conduct currents as their gate terminals are not provided with driving signals for adjustment, and the terminal of the resistor 22 is floating so that the potential of the capacitor 21 does not change.

When the input Xi of the i-th synapse element turns ON, the gate terminal of the second n-channel MOS transistor 12 is provided with the power voltage Vdd so as to conduct current through the transistor, the output current of the synapse element becomes to the corresponding value to $\omega_i X_i$ according to the effective β-value decided by the gate voltage Vcontr of the first n-channel MOS transistor 11.

All of the output currents of the synapse elements that receive input signals selected from the parallel connected synapse elements are added up and flow through the p-channel MOS transistor. Therefore, the output voltage Vout at the connection point turns to have the corresponding value to $\Sigma \omega_i X_i$. Thus truth of a logical function set in the threshold circuit can be decided by comparing the output voltage Vout with the predetermined threshold value α set in the comparing inverter. The output inverter 52 is used for adjusting the logical output and the electrical output signal of the comparing inverter 50.

The above mentioned neuron circuit provides in real time the truth or falseness of the logical function via output signal from the output inverter 52, via appropriate weights set on each of the synapse elements 10, an appropriate threshold value α of the comparing inverter 50 and an appropriate β-value βp of the p-channel MOS transistor 40 according to the logical function to be solved. The neuron circuit provides output signal y of '1' when the logical function is true according to a certain set of the input signals, otherwise the circuit provides signal '0'.

For example, let us consider a circuit for solving the following function:

$$Y = X1(X2 + X3(X4 + X5(X6 + X7))) \quad (6).$$

First, the function is to be transformed to the form of $Y = \text{Sign}(\Sigma \Omega_i X_i - T)$.

A logical function Y being a logical sum of n inputs Xi's can be transformed to $Y = \text{Sign}(\Sigma X_i - 1)$, and a logical function Y being a logical product of n inputs Xi's can be transformed to $Y = \text{Sign}(\Sigma X_i - n)$. In general, a coefficient $\Omega_i$ of a variable Xi in the logical function may be determined by the above-mentioned rule.

For complex functions, the coefficients may be determined from the variables in the innermost parenthesis according to the following rules:

1. if a new variable Xj is logically added to the existing function, a coefficient Ωj for the new variable Xj has the same value as the preceding threshold value Tj−1, and the new threshold value Tj is held to the preceding threshold value Tj−1, and 2. if the new variable Xj and an existing function are subjected to logical product, the coefficient Ωj for the new variable Xj has a value (ΣΩj−Tj−1+1) or a sum of 1 and a result of subtraction of the preceding threshold value Tj−1 from a total sum of coefficients Ω of the preceding variables ΣΩj, and the new threshold value Tj turns to (ΣΩj+1).

The logical function (6) is calculated by the above manner as follows:

$$Y=Sign(13X1+8X2+5X3+3X4+2X5+X6+X7-21) \quad (7)$$

The above function (7) is normalized to the form of Y=Sign(ωiXi−1) as follows:

$$Y=Sign(0.65X1+0.344X2+0.215X3+0.129X4+0.086X5+0.043X6+0.043X7-1) \quad (8).$$

The neuron circuit representing the logical function (8) may be formed by 7 synapse elements 10 connected in parallel and a p-channel MOS transistor 40 connected in series with the parallel set of the synapse elements. The effective β-value βj of each synapse element is set according to the respective coefficient ωj, and the effective β-value of the p-channel MOS transistor 40 is set to (1−δ), where δ is an adequate value smaller than the minimum differential in the coefficients in the logical function. The above neuron circuit provides truth of the logical function Y via output of the output inverter 52 when the threshold value of the comparing inverter 50 is set to 0.5 of the power voltage Vdd, because the output voltage Vout exceeds 0.5 of the power voltage Vdd if the logical function Y is true and Vout does not reach 0.5 of Vdd if Y is false.

The reason of setting the effective β-value of the p-channel MOS transistor 40 to (1−δ) is to avoid ambiguity in decision. The threshold value of the comparing inverter 50 may be adjusted instead of the above effective β-value.

Note that the weights of inputs are not unique but sufficiently elastic because the same Boolean threshold function corresponds to a "bunch" of separating hyperplanes. For example, for the function (8) transformed from the function (7), an equivalent ration form as below can be built in which Ω6=2 Ω7 instead of Ω6=Ω7 in (7):

$$Y=Sign(0.61X1+0.39X2+0.24X3+0.15X4+0.12X5+0.06X6+0.03X7-1) \quad (9).$$

Figure 8:
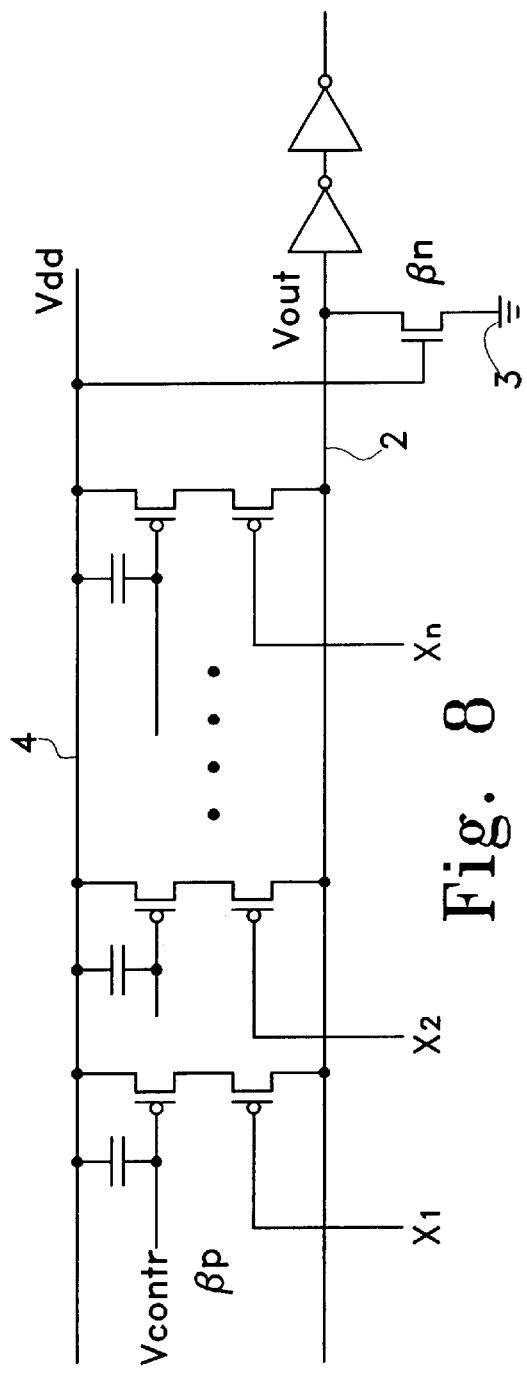
FIG. 8 is a circuit diagram showing another aspect of the neuron device of the invention.

FIG. 8 shows a neuron circuit constructed from synapse elements formed by the p-channel MOS transistors as shown in FIG. 5.

The parallel connected synapse elements are disposed between the power line 4 and the intermediate potential line 2, and the complemental n-channel MOS transistor is disposed between the intermediate potential line 2 and the ground line 3.

The effective β-value of each synapse element is adjusted corresponding to the input weight of the synapse via control voltage Vcontr. The current amplification factor βn of the complemental n-channel MOS transistor is adjusted to (1−δ).

The connecting terminal of the synapse elements and the n-channel MOS transistor is connected to the input terminal of the comparing inverter. The output signals receives the output signal from the comparing inverter, transverses it and outputs it as output signal from the synapse element.

The above-mentioned neuron circuit works just the same as the neuron circuit shown in FIG. 7.

Each of the above mentioned synapse elements furnishes with one set of adjusting transistor set for charging and discharging electric charges in the capacitor 21. The p-channel MOS transistor 31 and the n-channel MOS transistor 32 are provided with driving signals from outside through the signal line. The adjusting transistor set functions to adjust the weight coefficient during learning process. Once change of weights is required, all synapse elements which are provided with input signals are to be changed in the same direction. Therefore the synapse elements may be divided into an adequate number of groups, and each group of synapse elements may furnish with one adjusting transistor set and connected with its output line.

Figure 9:
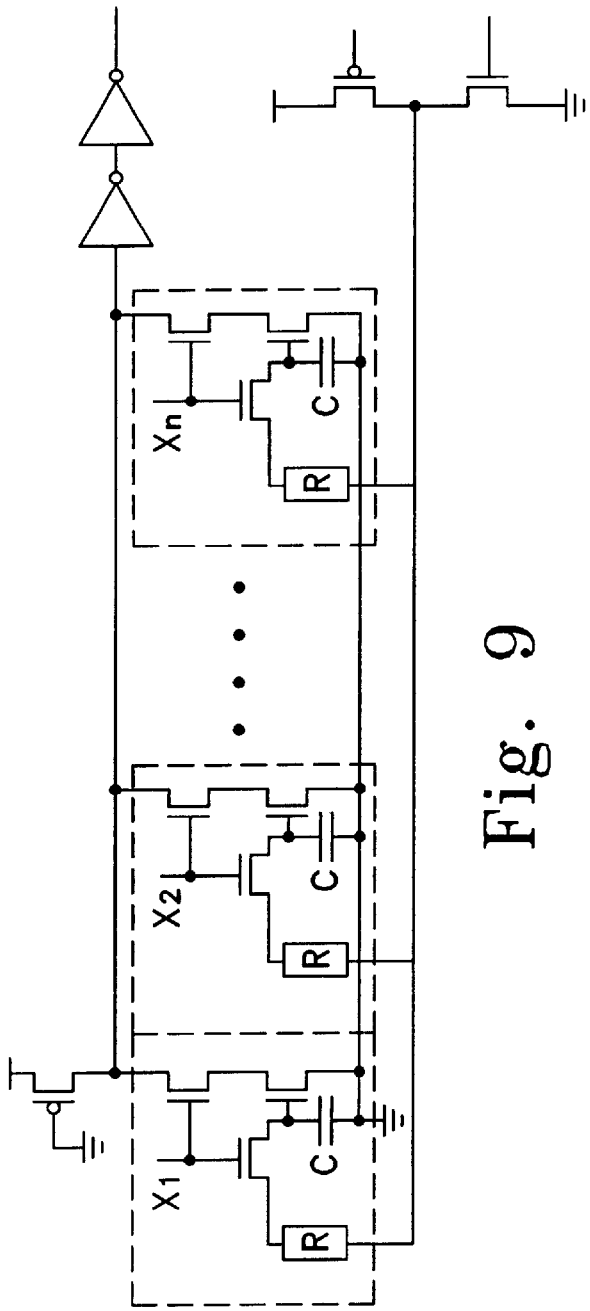
FIG. 9 is a circuit diagram showing further aspect of the neuron device of the invention.

FIG. 9 shows a neuron circuit having adjusting transistor sets for adjusting β-values of the group of synapse elements, respectively. This construction can provide more economical circuit having less number of semiconductor elements.

Figure 10:
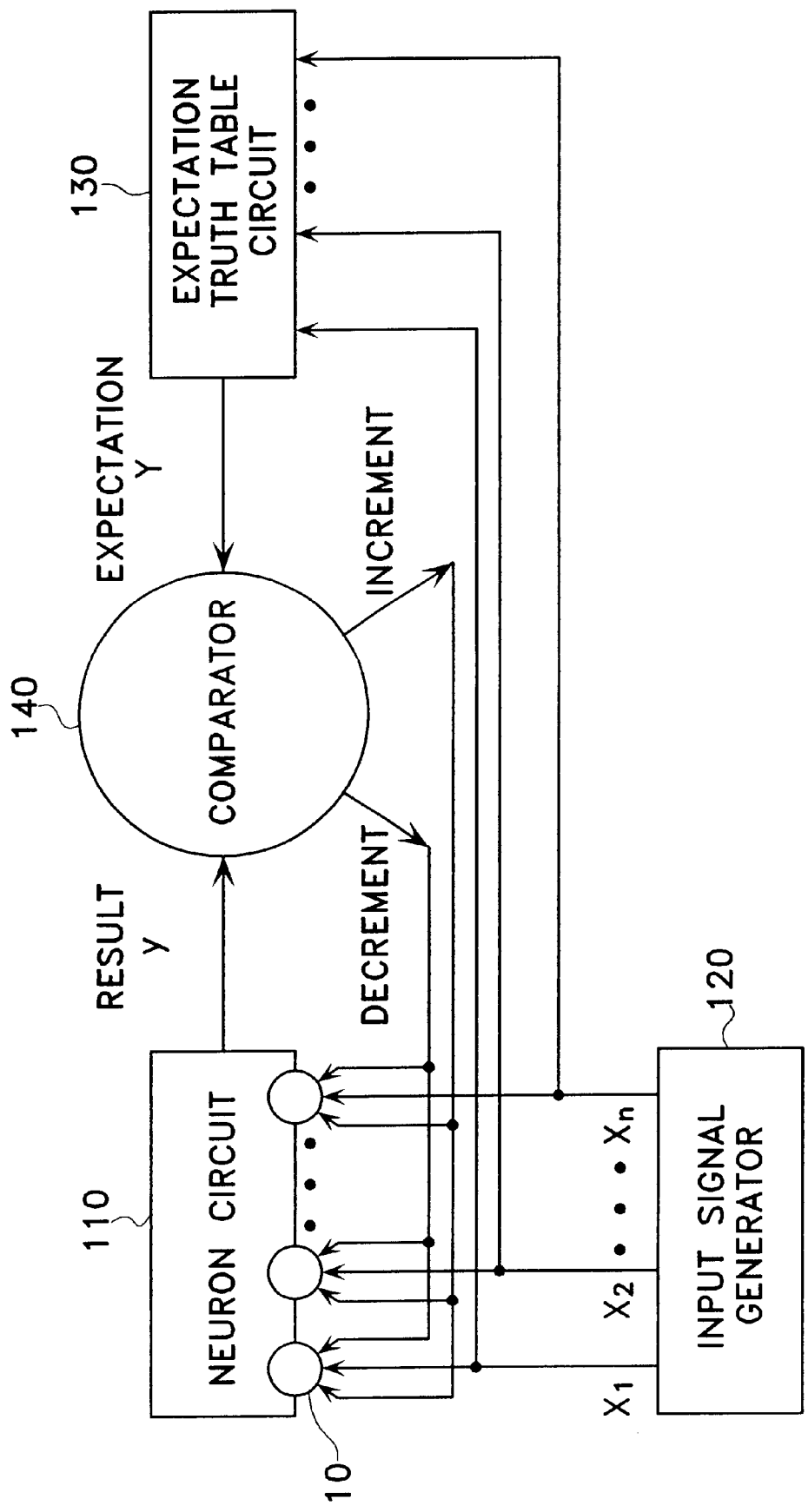
FIG. 10 is a block diagram showing a learnable neuron device of the invention.

FIG. 10 shows a circuit of a learnable neuron device manufactured with the above mentioned neuron circuits.

As shown in FIG. 10, the neuron device of the invention comprises a neuron circuit 110 as above described, an input signal generator 120, an expectation truth table circuit 130, and comparator 140.

The neuron circuit 110 furnishes with necessary number of synapse elements 10, the input signal generator 120 provides a set of output signals X1, X2, . . . , Xn corresponding to each synapse element. The neuron circuit 110 outputs a result y as comparison result of a threshold value α of a comparing inverter with a sum of output voltages Vout each of which is calculated from a plural inputs by each synapse element.

The input signal generator 120 provides all of the possible sets of input signals to the synapse elements repeatedly in an adequate order. For example, the synapse elements may be uniquely assigned with a bit order of binary number, then the input signal generator 120 may scan from binary number 0 providing no input signal to all elements up to the maximum number providing an input signal to whole elements. The input signal generator 120 also provides the output signal to the expectation truth table circuit 130.

The expectation truth table circuit 130 records an expectation truth table for the logical function. The expectation truth table is a table of truth of the logical function to be calculated by the neuron circuit predetermined for every set of input signals. The expectation truth table circuit 130 provides signals of truth or falseness according to the set of input signals X1, X2, . . . , Xn from the input signal generator 120.

The comparator 140 decides the performance of the neuron circuit 110 by the comparison results of the output y of the neuron circuit 110 with the output Y of the expectation truth table circuit 130. The comparator 140 provides no signal if both outputs have the same values, otherwise provides the synapse elements 10 of the neuron circuit 110 with β-value increment signals or β-value decrement signals via control line according to the sign of deviation between the output y and the output Y.

For example, if the output Y of the expectation truth table circuit 130 is 0 and the output y of the neuron circuit 110 is 1, the weights are too large, then the comparator 140 provides decrement signals for decreasing the weights by discharging the capacitors to the ground line so as to lower the voltage applied to the gate electrodes. On the contrary, if the output Y of the expectation truth table circuit 130 is 1 and the output y of the neuron circuit 110 is 0, the weights are too small, then the comparator 140 provides increment signals for increasing the weights by charging the capacitors from the power line so as to raise the voltage applied to the gate electrodes. The control line for increment signal and the control line for decrement signal are not provided with signals at the same time.

The comparator 140 provides β-value change signals to all synapse elements 10. Only the synapse elements vary their β-value which input signals Xi are active so as to make their switching transistors conductive. The other synapse elements not relating to the logical function hold the gate potential as it is, because the switching transistors cut off the current so as to maintain the charges in the capacitors.

This simplified construction in which only the active synapses in the logical operation should be adjusted with their weight functions is reasonable and sufficiently contribute to decrease learning cycles.

There are two possible modes of learning that depend on the time constant of the capacitor charge.

The first mode is a "forced" mode when the time constant τ<t, where t is continuation time of an input set in learning. In this case, the output of the threshold element correctly switches in every cycle of the learning and switches off the signal increment or decrement. The learning process in this case is sensitive to the noise which is caused, for example, by disordered edges of the threshold element output signal and sample sequence. An additional external clocking can eliminate the influence of this noise.

The second mode is a "soft" mode when the time constant τ>>t. In this case, the learning process is not sensitive to the noise, or short hazards, on signals increment or decrement, but the learning requires a considerably bigger number of exposing the sample sequence.

Figure 12:
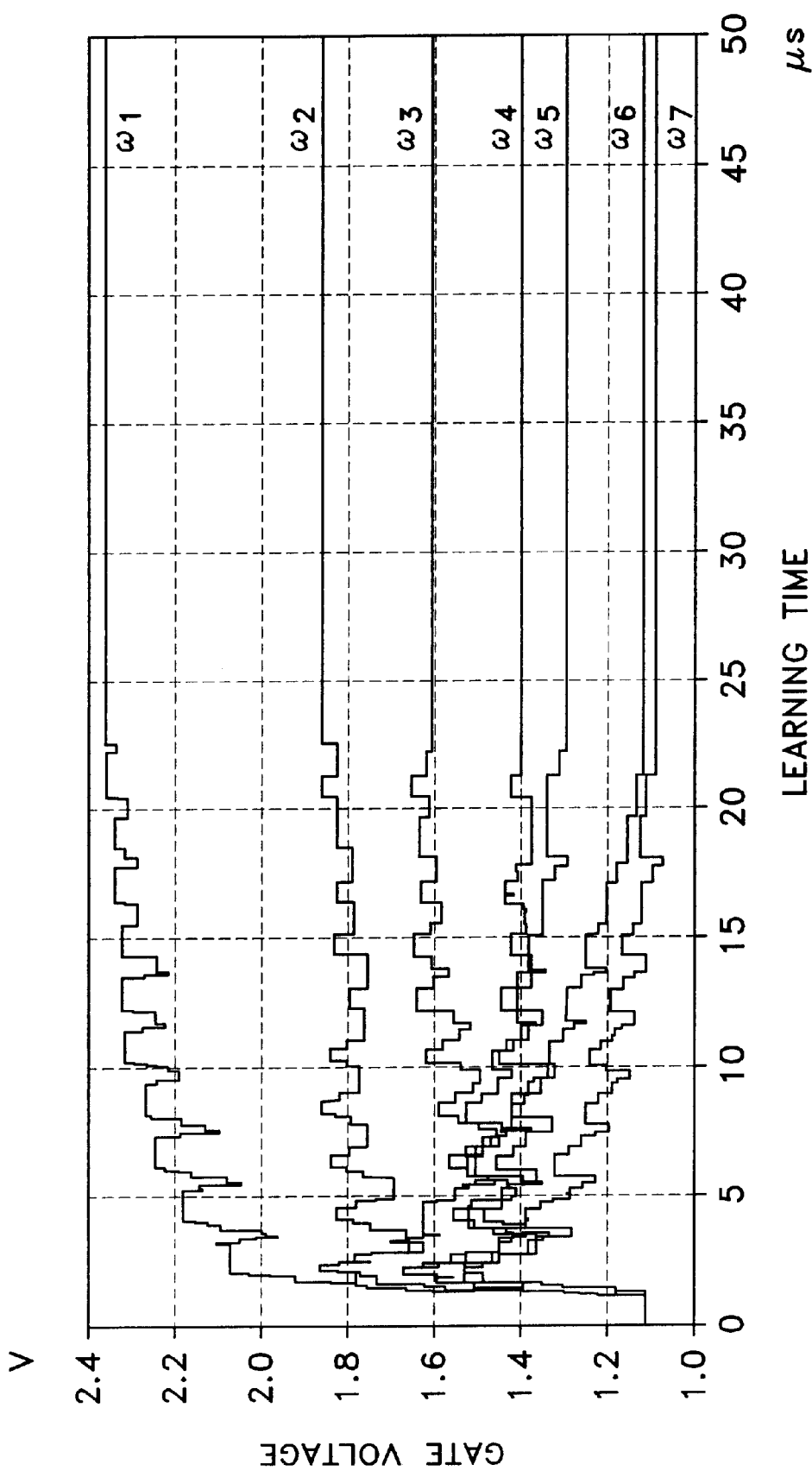
FIG. 12 is a time chart showing stability of the parameters in learning process in the neuron device of the invention.
Figure 13:
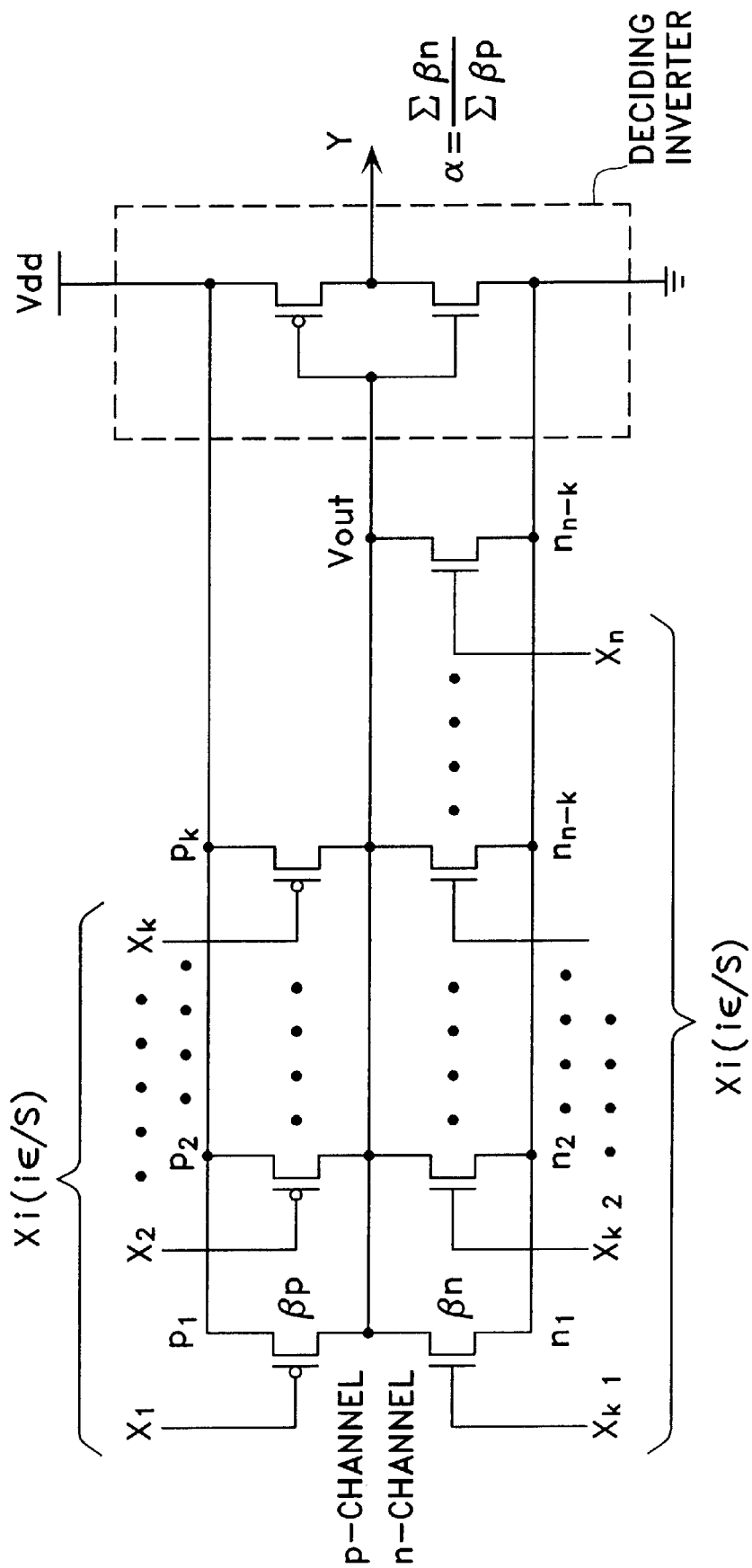
FIG. 13 is a circuit diagram of the conventional neuron element.

FIGS. 11A, 11B and FIG. 12 are showing an experiment result of the learnable neuron device of FIG. 10 for testing reliability and learnability. The charge time constant provides a mode median between the forced and soft ones, with a clock signal of duration 4 nsec and frequency 125 MHz.

Referring to FIG. 10, the neuron circuit 110 used in this experiment has seven synapse elements 10, and the output signals from the input signal generator 120 are provided to all of the synapse elements. The input signal generator 120 generates repeatedly all combinations of output signals to each synapse element.

The neuron circuit 110 outputs the comparison result of the comparing inverter comparing the accumulated output signal Vout from all of the synapse elements with the threshold value a. The expectation truth table circuit 130 records a truth table of the function (6), and provides logical result of truth or falseness according to the set of output signals from the input signal generator 120.

The comparator 140 compares the output from the neuron circuit 110 and the output from the expectation truth table circuit 130 and provides β-value adjust signals for compensating β-values of the synapse elements 10 when the outputs above do not agree.

The neuron device was simulated by SPICE for estimating its performance.

The simulation executed learning process by the neuron device in which the input signal generator 120 provided repeatedly and periodically input signals under the condition that every one set of input signals continued in a continuation time t of 16 nsec, and all combinations of $2^7=128$ sets of output signals were provided in 2048 nsec.

FIG. 11A shows status around completion of learning at about 25 μsec passed after the start. The axis of abscissas represents time elapsed. FIG. 11B shows status of early stage of learning at about 5 μsec passed after the start. The lower charts show the output Y from the expectation truth table circuit and the upper charts show the on-off output y of the neuron circuit and the output voltage Vout changing with small steps representing a total sum of outputs from the synapse elements of the neuron circuit.

As shown in FIG. 11B, the output y of the neuron circuit and the output Y of the expectation truth table circuit sometimes have deviations from each other in early stage of learning. Although both of the outputs are well coincident with each other after some learning cycles as shown in FIG. 11A, so that the neuron circuit operated the logical operation of the function (6) exactly.

FIG. 12 shows change of the gate voltages of every synapse element.

The gate voltages set at arbitrary values at start point approach the proper values rapidly, and reach their proper values and stabilize having the correct weights around 23 μsec passed after beginning in this case.

After the weights are decided for all synapse elements, the input terminals of the synapse elements are switched to be provided with the actual input signals from the operational object so that the neuron device can execute high quality information processing operations via simulating human neurons. The synapse element can be constructed in very small area less than 1 μm square, even by the conventional technology.

As described above, the synapse elements of the invention can be constructed and easily integrated in small and simple circuits even by the usual technology. The synapse elements are easily adjusted with weight functions and added with learning abilities.

The neuron circuits formed with the synapse elements can be integrated in a semiconductor substrate of integrated circuit, and many circuits can be accumulated in one body, thus practical neuron circuits can be provided.

Furthermore, learning abilities added to the circuits easily provides logical operation circuits for corresponding to any logical functions.

What is claimed is:

1. A synapse element comprising a transistor set made of a first MIS (metal insulator semiconductor) transistor having a first gate electrode and a second MIS transistor having a second gate electrode, the second MIS transistor connecting in series with the first MIS transistor, in which an effective β-value of the transistor set is adjusted by voltage of a first input signal provided to the first gate electrode, and the transistor set is switched according to a second input signal provided to the second gate electrode.

2. A synapse element as claimed in claim 1, wherein the first MIS transistor and the second MIS transistor are incorporated in one MIS body, and the MIS body has at least two gate electrodes.

3. A synapse element as claimed in claim 1, further comprising a voltage holding element connected with the first gate electrode, and a switch element between the first gate electrode and terminals each connected to a high voltage power source and a low voltage power source, in which the switch element is switched according to the second input signal.

4. A synapse element as claimed in claim 3, in which the switch element is a MIS transistor having a gate electrode receiving the second input signal, and the voltage holding element is a capacitance element.

5. A threshold circuit comprising:
    a first power supply line and a second power supply line, both connecting with a power source, a plural number of transistor sets made of a series connection of a first MIS transistor and a second MIS transistor, both having the same channel type, at least one of third MIS transistor having the complementary channel type to the first and second MIS transistors, and an output inverter, the first MIS transistor adjusting an effective β-value of the transistor set according to voltage of a first input signal provided to the gate electrode of the first MIS transistor, and the second MIS transistor switching the transistor set according to a second input signal provided to the gate electrode of the second MIS transistor, wherein the third MIS transistor is connected to the first power supply line with its source electrode and to the second power supply line with its gate electrode, the plural number of transistor sets are connected with each other in parallel and the transistor sets are connected to the second power supply line with their source electrodes and to the drain electrode of the third MIS transistor with their drain electrodes, and the drain electrodes are connected with an input terminal of the output inverter.

6. A threshold circuit as claimed in claim 5, wherein the first and the second MIS transistors are n-channel type MIS transistors, the third MIS transistor is a p-channel type MIS transistor, the first power supply line is a positive power line connected with a positive terminal of a power source, and the second power supply line is a negative power line connected with a negative terminal of the power source.

7. A threshold circuit as claimed in claim 5, wherein the first MIS transistor and the second MIS transistor are incorporated in one MIS body, and the MIS body has at least two gate electrodes.

8. A threshold circuit as claimed in claim 5, wherein each of the effective β-values is adjusted to a corresponding value (ωi which is derived from a logical equation Y=sign(ΣωiXi−1) transformed from a logical equation Y=F(Xi), the transistor sets represents synapse elements and are connected with each other in parallel, and a comparator element compares a combined output signals with a threshold value and provides an output signal from the threshold circuit.

9. A neuron device comprising:

a first current-control element and a second current-control element being connected in series between a first potential line and a second potential line, an auxiliary circuit for varying a characteristic value of at least one of the second current-control element to be provided with an input signal, a threshold decision circuit being provided with a potential value at the connection point of the first current-control element and the second current-control element and deciding a logical value of the combination of the input signals, wherein the auxiliary circuit can adjust the logical value by changing the potential value at the connection point corresponding to the same combination of the input signals.

10. A neuron device as claimed in claim 9, wherein the first current-control element turns on constantly, and the second current-control element is controlled to turn on and off by an input signal to the second current-control element.

11. A neuron device as claimed in claim 9, wherein the second current-control elements are connected in parallel so to input a plural number of input signals.

12. A neuron device as claimed in claim 9, wherein the characteristic value is a current amplification factor.

13. A neuron device as claimed in claim 9, wherein the first current-control element and the second current-control element are complementary field-effect transistors to each other.

14. A neuron device as claimed in claim 13, wherein the auxiliary circuit comprises a voltage holding element connected with a gate electrode of the field-effect transistor and a switching element for making and breaking a current which charges or discharges the voltage holding element, and the switching element is controlled according to the input signals.

15. A neuron device as claimed in claim 9, wherein the second current-control elements are connected in parallel, and the neuron device further comprises a adjusting circuit for controlling the auxiliary circuit according to the comparison between the threshold decision and its expectation.

16. A neuron device as claimed in claim 9, wherein the threshold decision circuit is made of a plurality of parallel connected synapse elements each comprising the first current-control element and the second current-control element, the auxiliary circuit adjusts the characteristic value of the second current-control element so as to adjust the effective β-value of the set of the first current-control element and the second current-control element, the synapse element provides an output signal controlled by the effective β-value according to the input signals, and wherein the neuron device further comprises an input signal generator for providing input signals to each of the input terminals of the synapse elements, a truth table circuit for providing an output expectation value corresponding to any set of input signals, a comparator for comparing the output expectation value and the output signal from the threshold decision circuit, and an adjusting circuit for selectively providing control signal to adjust the effective β-value corresponding to the output of the comparator, and the adjusting circuit is connected to the terminal of the synapse element for receiving the adjusting signal of the effective β-value only when the synapse element is activated by the input signal, so that the neuron device is provided with learnable ability.

17. A neuron device as claimed in claim 16, the first and the second current-control elements being MIS transistors of the same channel type, the neuron device further comprising a first power supply line and a second power supply line connecting with an output terminal of a power source respectively, at least one of third MIS transistor having the complementary channel type to the first and second MIS transistors, and an output inverter, the first current-control element adjusting the effective β-value of the transistor set according to voltage of a first input signal provided to the gate electrode of the first current-control element, and the second current-control element switching the transistor set according to a second input signal provided to the gate electrode of the second current-control element, wherein the third MIS transistor is connected to the first power supply line with its source electrode and to the second power supply line with its gate electrode, the plural number of transistor sets are connected with each other in parallel and the transistor sets are connected to the second power supply line with their source electrodes and to the drain electrode of the third MIS transistor with their drain electrodes, and the drain electrodes are connected with an input terminal of the output inverter.

* * * * *